(12) United States Patent
Im et al.

(10) Patent No.: US 12,148,589 B2
(45) Date of Patent: Nov. 19, 2024

(54) SHAPE-TRANSFORMABLE SWITCH APPARATUS BASED ON ELECTRORHEOLOGICAL FLUID

(71) Applicants: Korea University Of Technology And Education Industry-University Cooperation Foundation, Cheonan-si (KR); Kia Corporation, Seoul (KR); Hyundai Motor Company, Seoul (KR)

(72) Inventors: Yoon Im, Suwon-si (KR); Yong Won Choi, Seoul (KR); Myung Hoe Kim, Seoul (KR); Joo Hwa Kim, Hwaseong-si (KR); Eun Jae Shin, Cheonan-si (KR); Hyun U Ko, Cheonan-si (KR); Sang Youn Kim, Seoul (KR)

(73) Assignees: Hyundai Motor Company, Seoul (KR); Kia Corporation, Seoul (KR); Korea University of Technology and Education Industry-University Cooperation Foundation, Cheonan-si (KR)

( * ) Notice: Subject to any disclaimer, the term of this patent is extended or adjusted under 35 U.S.C. 154(b) by 162 days.

(21) Appl. No.: 18/048,787

(22) Filed: Oct. 21, 2022

(65) Prior Publication Data
US 2023/0260735 A1    Aug. 17, 2023

(30) Foreign Application Priority Data
Feb. 16, 2022 (KR) .................. 10-2022-0019863

(51) Int. Cl.
*H01H 59/00* (2006.01)
(52) U.S. Cl.
CPC .................. *H01H 59/00* (2013.01)

(58) Field of Classification Search
CPC .............. H01H 59/00; H01H 2215/05; H01H 2003/008; G06F 3/016; H03K 17/962; H03K 2217/96062
(Continued)

(56) References Cited

U.S. PATENT DOCUMENTS

| 5,222,895 A | 6/1993 | Fricke |
| 5,496,174 A | 3/1996 | Garner |

(Continued)

FOREIGN PATENT DOCUMENTS

| JP | H07141957 A | 6/1995 |
| KR | 20100120423 A | 11/2010 |

(Continued)

OTHER PUBLICATIONS

Machine translation of Choi et al. Korean Patent Document KR 2017-0046217 A May 2017 (Year: 2017).*

*Primary Examiner* — Kevin J Comber
(74) *Attorney, Agent, or Firm* — Slater Matsil, LLP

(57) ABSTRACT

In an embodiment a shape-transformable switch apparatus includes a housing comprising an accommodating region with a high voltage electrode, a Electrorheological (ER) fluid located in the accommodating region, the ER fluid configured to change viscosity and rigidity, a switch cover shielding an upper portion of the housing, the switch cover configured to change a shape based on changes of the viscosity and of the rigidity of the ER fluid; and a controller configured to allow a voltage to be applied to the high voltage electrode such that an electrostatic attraction is generated so that the ER fluid flows and is pressed against the switch cover thereby changing a shape of the switch cover.

11 Claims, 6 Drawing Sheets

(58) Field of Classification Search
USPC .......................................................... 361/211
See application file for complete search history.

(56) References Cited

U.S. PATENT DOCUMENTS

| | | |
|---|---|---|
| 8,749,498 B2 | 6/2014 | Lim et al. |
| 2009/0002328 A1* | 1/2009 | Ullrich ................. G09B 21/004 345/173 |
| 2010/0236843 A1 | 9/2010 | Englund |
| 2010/0321335 A1* | 12/2010 | Lim ..................... G09B 21/004 345/174 |

FOREIGN PATENT DOCUMENTS

| | | | | |
|---|---|---|---|---|
| KR | 20110080057 A | 7/2011 | | |
| KR | 101658991 B | 9/2016 | | |
| KR | 2017046217 A | * 5/2017 | ............... | G01L 1/14 |
| KR | 20170046217 A | 5/2017 | | |
| KR | 101784436 B1 | 10/2017 | | |

* cited by examiner

SHAPE-TRANSFORMABLE SWITCH APPARATUS BASED ON ELECTRORHEOLOGICAL FLUID

CROSS-REFERENCE TO RELATED APPLICATIONS

The present application claims priority to Korean Patent Application No. 10-2022-0019863, filed Feb. 16, 2022, the entire contents of which are incorporated herein for all purposes by this reference.

TECHNICAL FIELD

The present disclosure relates to a shape-transformable switch apparatus based on an Electrorheological (ER) fluid. More particularly, the present disclosure relates to a shape-transformable switch apparatus based on an ER fluid, the apparatus using the ER fluid in which mechanical characteristics such as viscosity and rigidity are increased when a voltage is applied to the ER fluid, thereby optionally transforming a shape of a switch to be an embossed shape when an operation is performed to provide a sensation of actually pushing the switch to a user.

BACKGROUND

Generally, an Electrorheological (ER) fluid refers to a fluid in which mechanical characteristics are changed according to an intensity of an electric field applied to the ER fluid. Generally, the ER fluid may be a colloidal solution prepared by dispersing conductive particles in a non-conductive solvent.

The ER fluid has characteristics of a Newtonian fluid having a random structure when the electric field is not applied to the ER fluid, but the ER fluid becomes to a Bingham fluid having a yield shear stress when the electric field is applied to the ER fluid.

The ER fluid has reversible fluidity which may quickly change to a liquid state or a solid state, and the yield shear stress may be continuously changed by adjusting the intensity of the electric field.

Such a device applying these characteristics of the ER fluid has advantages of a simple design, low manufacturing cost, no noise, no vibration, fast response characteristics, continuous control performance, low power consumption, and so on. Further, by using these advantages, the ER fluid is applied in a damper, an engine mount, a clutch, a brake, a knob, and so on.

Meanwhile, a Magnetorheological (MR) fluid has the same mechanical characteristics of the ER fluid by being applied with a magnetic field. Further, the MR fluid is prepared by dispersing paramagnetic particles in a solvent having low permeability.

Here, an application range of a MR fluid application device is similar to an application range of the ER fluid, and the MR fluid has been utilized and commercialized in a damper, a mount, a brake, and so on.

Conventionally, key components that determine the performance of the ER or MR fluid application devices include the ER or MR fluids, a design mechanism, a control logic, a peripheral power supplying device, and so on. Further, unlike the simple electrode design of the ER fluid application device, the MR fluid application device requires a design of a magnetic circuit for forming a magnetic field.

Such a design of a magnetic circuit affects inductance, a direction of a magnetic field applied to the MR fluid, and so on. Accordingly, the design of the magnetic circuit may affect the performance of the MR fluid application device.

Since the yield shear stress of the currently developed MR fluid is 20 times to 50 times larger than the ER fluid, the MR fluid application device can be miniaturized compared to ER fluid application device. In addition, a response speed of the MR fluid application device may be determined by a response speed of the MR fluid to a magnetic field, a response speed of a magnetic circuit, a time delay of a peripheral power supplying device, and so on.

Meanwhile, since a response speed of the ER fluid application device is dependent on a response speed of the ER fluid, and a time delay of a peripheral power supplying device, it is known that the response speed of the ER fluid application device is faster than the response speed of the MR fluid application device.

SUMMARY

Embodiments provide a shape-transformable switch apparatus based on an Electrorheological (ER) fluid, the apparatus being capable of providing a button sensation of actually pushing a switch. To this end, in a state in which a surface of the switch is maintained in a flat shape, as a voltage is applied to the apparatus, change in mechanical characteristics of the ER fluid accommodated inside the switch, such as increased viscosity and stiffness, optionally occurs, and the ER fluid is pressed by a thin-film member at the same time, so that the flat shape of the switch is optionally changed to an embossed shape.

Further embodiments provide a shape-transformable switch apparatus based on an Electrorheological (ER) fluid, the apparatus including: a housing provided with an accommodating region and provided with a high voltage electrode; the ER fluid filled in the accommodating region and configured such that viscosity and rigidity thereof are capable of being changed; a switch cover shielding an upper portion of the housing that is open, the switch cover being configured such that a shape of the switch cover is optionally changed according to changes in the viscosity and the rigidity of the ER fluid; and a controller configured to allow a voltage to be applied to the high voltage electrode such that electrostatic attraction is generated so that the ER fluid is pressed, the controller being configured such that the ER fluid flows by pressing the ER fluid, thereby controlling the switch cover such that the shape of the switch cover is capable of being changed.

The housing may include: a first filling portion which is disposed to be in contact with the high voltage electrode and in which the ER fluid is filled; a second filling portion which forms a step with the first filling portion and which extends, the second filling portion being connected to a center portion of the switch cover, and the second filling portion in which the ER fluid is filled together with the first filling portion; a ground electrode provided such that a shape of the ground electrode is optionally changed by the electrostatic attraction as the voltage is applied to the high voltage electrode; and a thin-film member configured such that a shape of the thin-film member is changed together with the ground electrode when the shape of the ground electrode is changed, the thin-film member being configured to press the ER fluid filled in the first filling portion.

Here, the first filling portion may form the step by having a width thereof longer than a width of the second filling portion, the thin-film member may shield opposite sides of the first filling portion together with the ground electrode, and the thin-film member may be configured to optionally press the ER fluid filled in the first filling portion when the electrostatic attraction is generated, thereby allowing the ER fluid to flow to the second filling portion.

In addition, the switch cover may be formed of soft material and may be formed in a flat shape, and may be configured such that a shape of the center portion of the switch cover is changed to protrude by the ER fluid that flows from the first filling portion to the second filling portion.

Meanwhile, the shape-transformable switch apparatus based on the ER fluid according to an embodiment may further include a sensor disposed inside the switch cover, the sensor being configured to sense a contact state by using a change in capacitance that is changed according to an approach distance of an object.

Preferably, the sensor may be formed of a carbon electrode layer, and may be attached to an inner side of the switch cover.

In addition, the controller may be configured to control the voltage by using the sensor such that the voltage is optionally applied to the high voltage electrode as the change in capacitance increases, thereby changing the shape of the switch cover.

In addition, in a state in which the shape of the switch cover is changed, the controller may be configured to control the voltage such that the voltage optionally applied is turned off when it is determined that a pressure is applied to the switch cover, thereby allowing the shape of the switch cover to return to an initial shape.

In the embodiments, in a state in which the surface of the switch is maintained in the flat shape, as the voltage is applied to the apparatus, change in mechanical characteristics of the ER fluid accommodated inside the switch, such as increased viscosity and stiffness, optionally occurs, and the ER fluid is pressed by the thin-film member at the same time, so that the flat shape of the switch is optionally changed to the embossed shape. Therefore, there is an effect that the button sensation of actually pushing the switch may be provided.

In addition, since mechanical characteristics of the ER fluid are used in embodiments, there is an effect that a structural simplification and an optimization of a package can be realized compared to a conventional actuator application structure that is for providing a button sensation.

In addition, in further embodiments, when a user's finger approaches or contacts the switch to operate the switch, the switch is changed to the shape that protrudes by sensing whether the user's finger approaches or contacts the switch. Further, by applying a structure in which the carbon electrode layer that is attachable is provided, there is an effect that proximity sensing can be realized through a simple structure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF ILLUSTRATIVE EMBODIMENTS

Hereinafter, an exemplary embodiment of the present disclosure will be described in detail with reference to the accompanying drawings.

Advantages and features of the present disclosure, and methods of achieving the advantages and the features, will be apparent from the accompanying drawings and from embodiments that are described in detail below.

However, the present disclosure is not limited to the embodiments disclosed below, but may be implemented in various different forms. The present embodiments are intended to complete the disclosure of the present disclosure and provided to fully inform the skilled in the art to which the disclosure pertains of the scope of the present disclosure. The present disclosure is defined only by the scope of the claims.

Furthermore, detailed descriptions related to well-known functions or configurations may be omitted in order not to unnecessarily obscure subject matter of the present disclosure.

Figure 1:
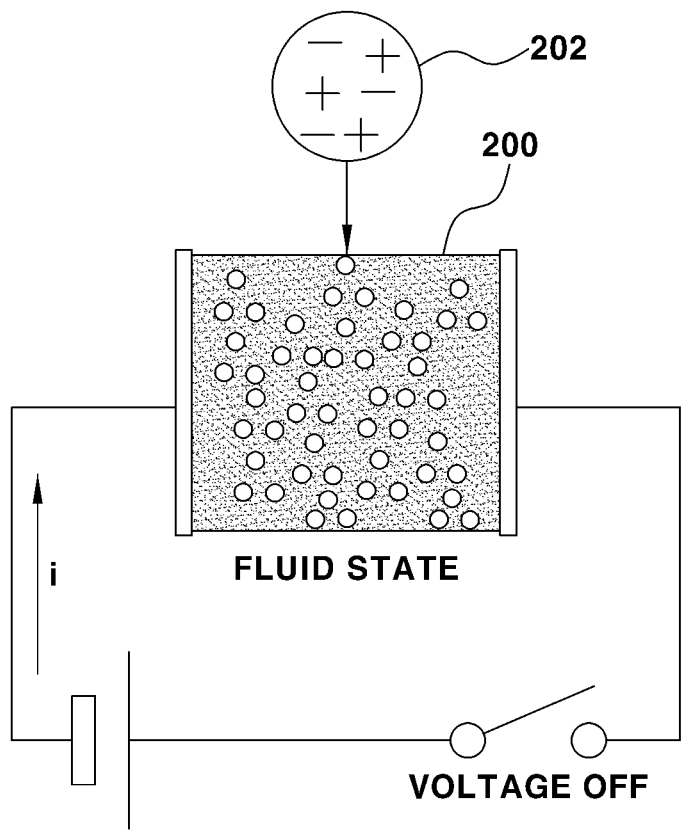
FIG. 1 is a conceptual view illustrating a state in which a voltage is not applied to a shape-transformable switch apparatus based on an Electrorheological (ER) fluid according to an embodiment of the present disclosure.
Figure 2:
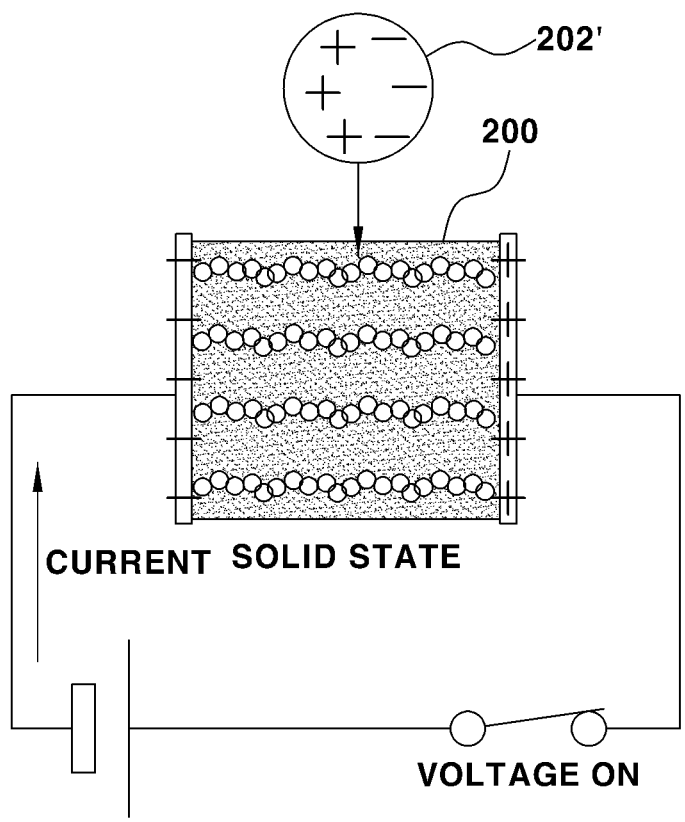
FIG. 2 is a conceptual view illustrating a state in which the voltage is applied to the shape-transformable switch apparatus based on the ER fluid according to an embodiment of the present disclosure.
Figure 3:
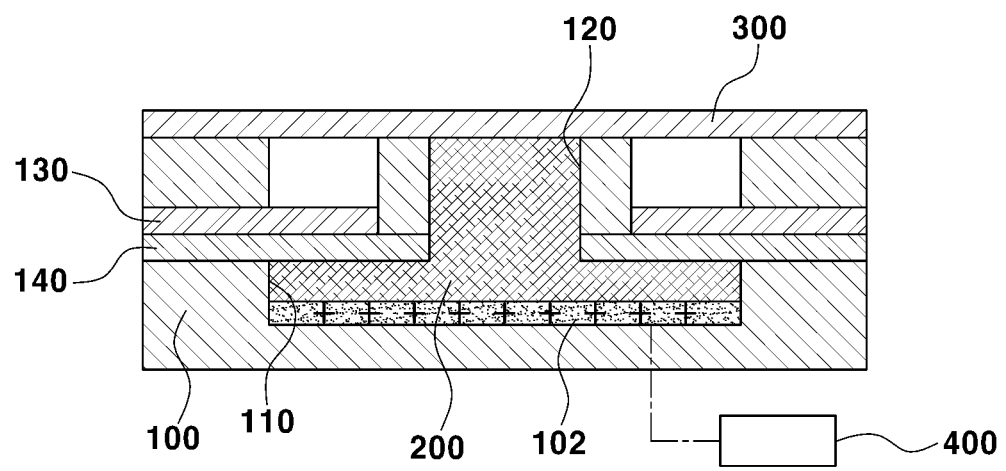
FIG. 3 is a view illustrating a configuration of the shape-transformable switch apparatus based on the ER fluid according to an embodiment of the present disclosure.

FIG. 1 is a conceptual view illustrating a state in which a voltage is not applied to a shape-transformable switch apparatus based on an Electrorheological (ER) fluid according to an embodiment of the present disclosure, FIG. 2 is a conceptual view illustrating a state in which the voltage is applied to the shape-transformable switch apparatus based on the ER fluid according to an embodiment of the present disclosure, and FIG. 3 is a view illustrating a configuration of the shape-transformable switch apparatus based on the ER fluid according to an embodiment of the present disclosure.

Figure 4:
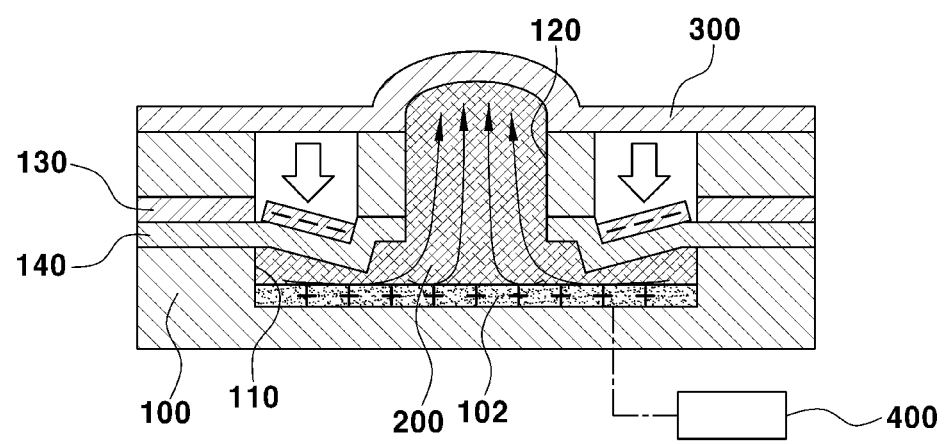
FIG. 4 is a view illustrating an operation when the voltage is applied to the shape-transformable switch apparatus based on the ER fluid according to an embodiment of the present disclosure.
Figure 5:
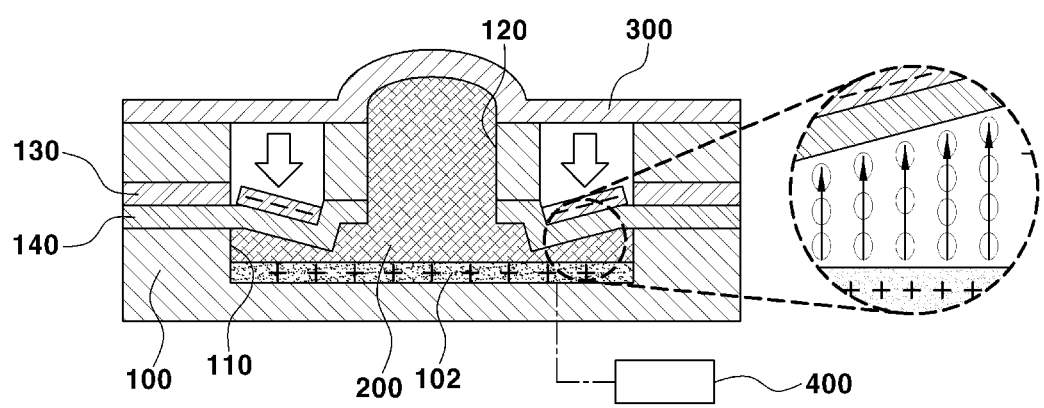
FIG. 5 is a view illustrating an operation when the voltage is maintained in the shape-transformable switch apparatus based on the ER fluid according to an embodiment of the present disclosure.
Figure 6:
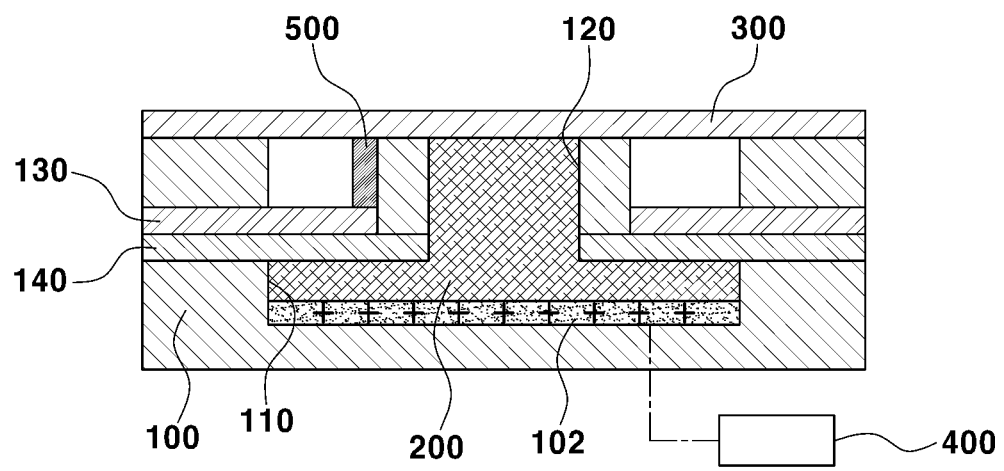
FIG. 6 is a view illustrating a sensor of the shape-transformable switch apparatus based on the ER fluid according to an embodiment of the present disclosure.

In addition, FIG. 4 is a view illustrating an operation when the voltage is applied to the shape-transformable switch apparatus based on the ER fluid according to an embodiment of the present disclosure, FIG. 5 is a view illustrating an operation when the voltage is maintained in the shape-transformable switch apparatus based on the ER fluid according to an embodiment of the present disclosure, and FIG. 6 is a view illustrating a sensor of the shape-transformable switch apparatus based on the ER fluid according to an embodiment of the present disclosure.

Conventionally, an Electrorheological (ER) fluid 200 is a colloidal solution in which strongly conductive particles are dispersed in a non-conductive solvent, and refers to all fluids in which mechanical properties thereof are reversibly changed according to a magnetic field applied thereto.

That is, ER particles 202 are filled in the ER fluid 200, and are configured to flow along a flow path of the ER fluid 200. Further, by appropriately adjusting a magnetic field that is applied to the ER fluid 200, the magnetic field being generated by applying an electric field to an inside of an electrode that includes the ER fluid 200, the ER particles 202 are excited, and the ER fluid 200 becomes a solid state.

That is, when the electric field is not applied to the ER fluid 200 as illustrated in FIG. 1, the ER fluid 200 exhibits a behavior of a Newtonian fluid in which particles dispersed in a non-conductive solvent are freely moved. However, when the electric field is applied to the ER fluid 200 as illustrated in FIG. 2, the ER fluid 200 exhibits characteristics of a Bingham fluid in which charged conductive particles form chain structures vertical to an electrode and have yield stress that resists a flow of a fluid.

In the ER fluid 200 as described above, when the electric field is not applied to the ER fluid 200, the ER fluid 200 has an isotropic characteristic in which particles dispersed in a fluid exhibit a free movement. However, when the electric field is applied to the ER fluid 200, the ER fluid 200 exhibits an anisotropic behavior in which particles dispersed in a fluid generate induced polarization and form a plurality of fibrous tissue. Further, the anisotropic behavior exhibits resistance to flow of the fluid or to shearing force applied from outside. At this time, since generated coupling force of the particles is resistant to the shearing force applied from outside, a characteristic that restricts the flow of the fluid is realized (see FIGS. 1 and 2).

A shape-transformable switch apparatus according to an embodiment of the present disclosure is operated by using these characteristics of the ER fluid 200. To this end, as illustrated in FIG. 3, an embodiment of the present disclosure may include a housing 100, the ER fluid 200, a switch cover 300, and a controller 400.

An inner portion of the housing 100 is provided with an accommodating region in which the ER fluid 200 is accommodated, and the housing 100 includes a high voltage electrode 102 having a length thereof corresponding to a width of the accommodating region.

Here, the housing 100 includes a first filling portion 110, a second filling portion 120, a ground electrode 130, and a thin-film member 140.

The first filling portion 110 is disposed such that the first filling portion 110 is in contact with the high voltage electrode 102, and is formed such that an accommodating space is formed and the ER fluid 200 is filled therein.

More preferably, in order for a distance between the high voltage electrode 102 that is disposed at a bottom surface of the first filling portion 110 and the ground electrode 130 that will be described later to be maintained at a predetermined distance, the first filling portion 110 is formed such that the first filling portion 110 has a predetermined height and the ER fluid 200 in a fluid state is filled inside the first filling portion 110.

In addition, the second filling portion 120 forms a step with the first filling portion 110, and extends upward. Further, an end portion of the second filling portion 120 is connected to a center portion of the switch cover 300.

In other words, the second filling portion 120 is provided to form the accommodating space with the first filling portion 110. Further, the second filling portion 120 is provided on a center of the first filling portion 110 and has a width that is smaller than the width of the first filling portion 110, thereby forming the step. Furthermore, the second filling portion 120 extends from the first filling portion 110, and the ER fluid 200 that is in the fluid state is filled inside the second filling portion 120.

The ground electrode 130 is provided such that a shape of the ground electrode 130 is changed by electrostatic attraction that is optionally generated as a voltage is applied to the high voltage electrode 102.

The ground electrode 130 is a reference electrode for the high voltage electrode 102. Further, the ground electrode 130 is configured such that the shape of the ground electrode 130 is changed to be directed toward the high voltage 102 by the electrostatic attraction generated when the voltage is applied to the high voltage electrode 102.

The thin-film member 140 configured such that a shape of the thin-film member 140 is also changed when the shape of the ground electrode 130 is changed. Further, the thin-film member 140 is configured to press the ER fluid 200 filled in the first filling portion 110, as the voltage is applied to the high voltage electrode 102.

More specifically, the thin-film member 140 shields opposite sides of the first filling portion 110 together with the ground electrode 130. Further, as illustrated in FIG. 4, when the voltage is applied, the thin-film member 140 optionally presses the ER fluid 200 from the opposite sides of the first filling portion 110, i.e., presses the ER fluid 200 from a region where the step is formed, the ER fluid 200 being filled inside the region. Therefore, the ER fluid 200 flows toward the center of the first filling portion 110 and toward the second filling portion 120 (see a direction of arrows in FIG. 4).

In a state in which the ER fluid 200 is pressed by the thin-film member 140 and flows toward the center of the first filling portion 110 and toward the second filling portion 120, when the applied voltage is continuously maintained, the center portion of the switch cover 300 is maintained in a protruding state by the ER fluid 200 that has flowed.

This situation is for applying a conventional hydraulically amplified self-healing electrostatic (HASEL) structure that generates a large transformation by forming an electrode having fluidity in an elastic body pocket in which dielectric liquid is filled and by applying an electric field so that a fluid movement caused by electrostatic attraction of the electrode is induced. Further, as described above, by maintaining the center portion of the switch cover 300 to be in the protruding state, the shape of the switch cover 300 can be changed such that the switch cover 300 having a flat shape initially can protrude optionally and can perform a button function.

That is, in various switches that are applied inside a vehicle, a touch-type switch structure has been recently applied to provide luxurious appearance. However, when the switch is operated, a feeling of a button cannot be provided, so that there is a problem that a feeling of operation is deteriorated.

Therefore, in order to solve this problem, in an embodiment of the present disclosure, the voltage applied to the high voltage electrode 102 is controlled by the controller 400, and the ER fluid 200 is pressed by the generation of the electrostatic attraction caused by the applied voltage, so that the viscosity and rigidity of the ER fluid 200 are increased. That is, as illustrated in FIG. 2, since the ER fluid 200 is changed to the solid state, the shape of the center portion of the switch cover 300 formed of soft material can be changed to the protruding shape. Therefore, even if a complex mechanical actuator structure is not separately applied, the button feeling according to the operation can be provided to the user by using the switch cover 300 that is transformed based on the ER fluid 200.

Meanwhile, as illustrated in FIG. 6, the shape-transformable switch apparatus based on the ER fluid according to an embodiment of the present disclosure may further include a sensor 500.

The sensor 500 is disposed inside the switch cover 300, and is configured to sense a contact state of a user's finger or the like by using a change in a capacitance that is changed according to an approach distance of an object.

Preferably, the sensor 500 is formed of a carbon electrode layer and is configured to realize a function of a capacitive proximity sensor having a simple structure. Further, the sensor 500 includes a layer formed of a tape so that the sensor 500 is attached to and disposed at an inner side of the switch cover 300.

That is, a conventional touch screen panel is an input device which allows a user to operate a display device by touching a display screen button of the display device with the user's finger and which can be easily operated by anyone. Further, as types of the touch screen panel for an example, a resistive type, a capacitive type, an infrared type, an ultrasonic type, and so on are used, and the capacitive type is mainly applied.

Such a capacitive type is a type using a capacitance in a human body, and has a principle in which the capacitance in the human body is used when the user touches the touch screen panel and which detects and calculates a size of an area where the amount of the current is changed and then detects a position. Further, by using this characteristics, the sensor 500 is configured to sense the contact state of the user's finger or the like through the change in capacitance that is changed according to an approach distance of the user's finger.

By using the sensor 500, when the change in capacitance is increased, the controller 400 controls the voltage such that the voltage is optionally applied to the high voltage electrode 102, thereby changing the shape of the switch cover 300.

In other words, if the user approaches the switch so as operate the switch, the change in capacitance that is detected according to a current flow change caused by the approach distance between the user's finger and the sensor 500 is also changed. Therefore, by using this situation, when the change in capacitance is detected by the sensor 500, the controller 400 controls the voltage such that the voltage is applied to the high voltage electrode 102. Accordingly, the ER fluid 200 is moved by being pressed by the ground electrode 130 and the thin-film member 140, and the viscosity and the rigidity of the ER fluid 200 are also increased, so that the shape of the switch cover 300 can be changed to the protruding shape.

As such, in a state in which the shape of the switch cover 300 is changed, when it is determined that the user's finger contacts the switch cover 300 and a pressure is applied to the switch cover 300, the controller 400 controls the voltage such that the voltage applied to the high voltage electrode 102 is turned off. Therefore, when the pressure by the user is applied to the switch cover 300 that protrudes, the switch cover 300 returns to the initial shape, i.e., the flat shape, so that the user may recognize that the switch is operated.

In the present disclosure, in a state in which the surface of the switch is maintained in the flat shape, as the voltage is applied to the apparatus, change in mechanical characteristics of the ER fluid accommodated inside the switch, such as increased viscosity and stiffness, optionally occurs, and the ER fluid is pressed by the thin-film member at the same time, so that the flat shape of the switch is optionally changed to the embossed shape. Therefore, there is an effect that the button sensation of actually pushing the switch may be provided.

In addition, since mechanical characteristics of the ER fluid are used in the present disclosure, there is an effect that a structural simplification and an optimization of a package can be realized compared to a conventional actuator application structure that is for providing a button sensation.

In addition, in the present disclosure, when a user's finger approaches or contacts the switch to operate the switch, the switch is changed to the shape that protrudes by sensing whether the user's finger approaches or contacts the switch. Further, by applying a structure in which the carbon electrode layer that is attachable is provided, there is an effect that proximity sensing can be realized through a simple structure.

While the present disclosure has been and described with reference to embodiment(s) illustrated in the drawings, the embodiment(s) are only illustrative, and it will be understood that various modifications can be made by those skilled in the art, and all or some of the described embodiment(s) may be optionally configured in combination. Accordingly, the true technical scope of the present disclosure should be defined by the technical spirit of the appended claims.

What is claimed is:

1. A shape-transformable switch apparatus comprising:
 a housing comprising:
  an accommodating region with a high voltage electrode accommodating an Electrorheological (ER) fluid;
  a first filling portion in contact with the high voltage electrode and filled with the ER fluid, wherein the ER fluid is configured to change viscosity and rigidity; and
  a second filling portion;
 a switch cover shielding an upper portion of the housing, the switch cover configured to change a shape based on changes of the viscosity and of the rigidity of the ER fluid; and
 a controller configured to allow a voltage to be applied to the high voltage electrode for generating an electrostatic attraction so that the ER fluid is deformed thereby changing the shape of the switch cover,
 wherein the second filling portion forms a step with the first filling portion, protruding from the first filling portion and connecting to a center portion of the switch cover, and
 wherein the second filling portion is filled with the ER fluid.

2. The apparatus of claim 1, wherein the housing further comprises:
 a ground electrode configured to change its shape by the electrostatic attraction when the voltage is applied to the high voltage electrode, and
 a thin-film member configured to change its shape together with the ground electrode when the shape of the ground electrode is changed, the thin-film member being configured to press against the ER fluid in the first filling portion.

3. The apparatus of claim 1, wherein a width of the first filling portion is larger than a width of the second filling portion.

4. The apparatus of claim 2, wherein the thin-film member is arranged on opposite sides of the protrusion of the second filling portion at the first filling portion together with the ground electrode, and wherein the thin-film member is configured to press the ER fluid filled in the first filling portion when the electrostatic attraction is generated thereby allowing the ER fluid to flow to the second filling portion.

5. The apparatus of claim 1, wherein the switch cover comprises a soft material.

6. The apparatus of claim 1, wherein the switch cover is formed in a flat shape, and is configured such that a shape of the center portion of the switch cover is changed to protrude by the ER fluid that flows from the first filling portion to the second filling portion.

7. The apparatus of claim 1, further comprising a sensor disposed inside the housing, wherein the sensor is configured to sense a contact state by using a change in capacitance that is changed according to an approach distance of an object.

8. The apparatus of claim 7, wherein the sensor comprises a carbon electrode layer and is attached to an inner side of the switch cover.

9. The apparatus of claim 7, wherein the controller is configured to control the voltage based on an input of the sensor such that the voltage is applied to the high voltage electrode when a capacitance increases.

10. The apparatus of claim 1, wherein, in a state in which the shape of the switch cover is changed, the controller is configured to control the voltage such that the voltage applied is turned off when it is determined that a pressure is applied to the switch cover, thereby allowing the shape of the switch cover to return to an initial shape.

11. The apparatus of claim 1, wherein the ER fluid is deformed based on changes to a magnetic field.

\* \* \* \* \*